United States Patent [19]
Irikawa et al.

[11] Patent Number: 5,926,585
[45] Date of Patent: Jul. 20, 1999

[54] WAVEGUIDE TYPE LIGHT RECEIVING ELEMENT

[75] Inventors: Michinori Irikawa; Kazuaki Nishikata; Takehiko Nomura, all of Kanagawa, Japan

[73] Assignee: The Furukawa Electric Co., Ltd., Tokyo, Japan

[21] Appl. No.: 08/849,189

[22] PCT Filed: Aug. 29, 1996

[86] PCT No.: PCT/JP96/02425

§ 371 Date: Jul. 18, 1997

§ 102(e) Date: Jul. 18, 1997

[87] PCT Pub. No.: WO97/08757

PCT Pub. Date: Mar. 6, 1997

[30] Foreign Application Priority Data

Aug. 29, 1995 [JP] Japan ................................. 7-243725

[51] Int. Cl.⁶ ............................................. G02B 6/12
[52] U.S. Cl. ..................................... 385/14; 385/131
[58] Field of Search ............................. 385/14, 129–132

[56] References Cited

U.S. PATENT DOCUMENTS

| 5,220,573 | 6/1993 | Sakata et al. | 372/50 |
| 5,727,096 | 3/1998 | Ghirardi et al. | 385/14 |

FOREIGN PATENT DOCUMENTS

| 0 558 089 | 9/1993 | European Pat. Off. |
| 60-4256 | 1/1985 | Japan . |
| 63-163407 | 7/1988 | Japan . |
| 2-33982 | 2/1990 | Japan . |
| 3-102515 | 4/1991 | Japan . |
| 3-96917 | 4/1991 | Japan . |
| 4-98880 | 3/1992 | Japan . |
| 4-233292 | 8/1992 | Japan . |
| 5-150198 | 6/1993 | Japan . |
| 7-66502 | 3/1995 | Japan . |
| 7-79203 | 3/1995 | Japan . |

*Primary Examiner*—John D. Lee
*Assistant Examiner*—Juliana K. Kang
*Attorney, Agent, or Firm*—Helfgott & Karas, PC.

[57] ABSTRACT

A waveguide type light receiving element (10) comprises a photodetector section (14), a photo-attenuator section (18), and an electrical isolation section (20) having a light transmission property which electrically isolates the photodetector section from the photo-attenuator section for allowing light transmission. The photodetector section comprises n-type light guide layer (28) and i-type light absorption layer (30) formed on a substrate (22), and a pair of n- and p-type light confinement layers (26 and 32) which sandwich the light guide layer and the light absorption layer therebetween, thereby forming a double hetero junction structure. The photo-attenuator section has a layer structure similar to the photodetector section except for a strained MQW layer disposed instead of the light absorption layer and has an absorption controlling electrode (16) and an electrode (40) disposed on the top and bottom, respectively, of the substrate. The light absorption layer and the waveguide of the photodetector section and the photo-attenuator section form a ridge structure to have a light confinement structure in a horizontal direction as well as a light confinement structure in a vertical direction. By applying a reverse bias voltage between the electrodes of the photo-attenuator section, the amount of absorption of the incident light by the photo-attenuator section can be controlled, thereby controlling the intensity of light propagated to the photodetector section.

2 Claims, 11 Drawing Sheets

WAVEGUIDE TYPE LIGHT RECEIVING ELEMENT

BACKGROUND OF THE INVENTION (a) Field of the Invention

The invention relates to a waveguide type light receiving element, and more particularly, to a waveguide type light receiving element which exhibits an excellent distortion characteristic over a broad band range and which is optimal for use in an optical communication system, such as an AM-FDM system, by attenuating incident light based on the intensity of the incident light to a given level.

(b) Description of the Related Art

In an optical communication system including the optical CATV system, amplitude modulation-frequency multiplex is effected by using AM(Amplitude Modulation)-FDM (Frequency Division Multiplex) method.

In the prior art, such an optical communication system employed a surface input type pin photodiode as shown in FIG. 11.

In the surface input type pin photodiode, an absorption layer, which is formed by InGaAs layer, is formed to have a large thickness, which is normally about 3 $\mu$m, to achieve a satisfactory light absorption efficiency. Since the carriers pass through the thick absorption layer to increase the transit time thereof and to retard the response, and also since an extensive light receiving area is required to achieve a sufficient sensitivity, the capacitance tends to be increased to thereby limit the operable band range to below 2 GHz.

However, the AM-FDM system mentioned above requires a light receiving element which is operable over a broad band range while exhibiting a low distortion characteristic.

Accordingly, attention is recently directed to a waveguide type pin photodiode as illustrated in FIG. 12, wherein FIG. 12(a) shows a schematic perspective view of the waveguide type pin photodiode and FIG. 12(b) shows the layer structure thereof together with the refractive indices of individual layers.

First, with the light receiving element, an incident light is received by a light incident surface which is formed on an end surface of the waveguide, and is absorbed during its propagation through the waveguide. Accordingly, the light absorption layer is formed to be as thin as about 0.6 mm. In addition, the light density of the incident light can be increased, which allows the area of the light receiving region to be reduced, thereby reducing the capacitance. Second, the light absorption layer, which is formed by non-doped InGaAs layer, is sandwiched at its upper and lower surfaces of the light absorption layer between a pair of p-InGaAs layer and n-InGaAsP layer which are heavily doped with impurities. Accordingly, the operable band is determined by the carrier transit time in the lightly doped thin InGaAs layer.

That is, the waveguide type light receiving element is operable in a ultra-high speed over a broad band range as high as 50 GHz or above.

However, although one of the important characteristics which are required of a light receiving element used in an analog optical transmission system is a wide dynamic range response, the conventional pin photodiodes of waveguide type do not exhibit a satisfactory wide dynamic range response. Specifically, a light receiving element which is constructed as having a sufficient sensitivity to a low signal amplitude loses its linearity in the relationship between the light signal and photo-current converted therefrom when it receives a large amplitude light signal having a higher intensity, thereby degrading its distortion characteristic. Accordingly, such a light receiving element suffers from a problem of limitation in the intensity of the input signal light.

In light of the foregoing problem, it is an object of the invention to provide a waveguide type light receiving element which exhibits a wide dynamic range response.

SUMMARY OF THE INVENTION

The inventors considered that a wide dynamic range response could not be realized by merely improving the structure of a photo-conversion region of a conventional waveguide type pin photodiode, and decided that the intensity of light to be propagated through the photo-conversion region should be controlled instead. Thus, the inventors noted that a photo-attenuator section might be provided which absorbs part of an incident light to be propagated through the photo-conversion region so as to control, based on the intensity of the incident light, the intensity of light propagating through the photo-conversion region.

To achieve the above object and based on the above finding, the invention is directed to a waveguide type light receiving element comprising: a photodetector section having at least a first light absorption layer and a first electrode pair for deriving an electrical signal from said first light absorption layer; and a photo-attenuator section having at least a second light absorption layer disposed between said photodetector section and a light incident surface and optically coupled to said first light absorption layer, and a second electrode pair electrically isolated from said first electrode pair for applying a voltage to said second light absorption layer.

According to the invention, in the waveguide type light receiving element having a photodetector section and a photo-attenuator section both formed on a compound semiconductor, the photo-attenuator section absorbs part of incident light based on the intensity of the incident light to attenuate the incident light, thereby adjusting the intensity of the light propagating to the photodetector section so as to control the sensitivity of the photodetector section. In this construction, even when receiving a large amplitude signal light having a higher intensity, the light receiving element, which is designed to have a sufficient sensitivity to a received light of a small signal intensity, attenuates the incident light by a suitable amount to thereby maintain a sufficient linearity as a light receiving element, and thereby, maintains an excellent distortion characteristic. Accordingly, a waveguide type light receiving element is realized which has an excellent distortion characteristic for input lights having different intensities in signal level, and thereby has a broad dynamic range response.

The light absorbing layer in the photo-attenuator section may be formed in a multiple quantum well structure or a strained super-lattice structure having a certain absorption wavelength edge, wherein the mount of light absorption by the photo-attenuator section is varied by applying a reverse bias voltage to the photo-attenuator section.

According to the invention, by providing a waveguide type light receiving element wherein a photodetector section and a photo-attenuator section are formed on a compound semiconductor, a part of the incident light is absorbed to be attenuated by the photo-attenuator section based on the intensity of the incident light, thereby adjusting the light intensity propagated to the photodetector, and thereby controlling the light sensitivity of the photodetector section. In this manner, the waveguide type light receiving element, which is designed for a sufficient sensitivity for a small signal light, achieves an excellent wide dynamic range response while maintaining an excellent distortion characteristic when receiving a large amplitude signal light.

By forming the second light absorption layer in a strained super-lattice structure, polarization dependency of the amount of attenuation by the photo-attenuator section can be suppressed. In addition, by applying a reverse bias voltage to the second electrode to thereby vary the amount of attenuation of the incident light by the photo-attenuator section, the sensitivity of the photodetector section can be electrically controlled. By providing an electrical isolation section, a magnitude of dark current in the photodetector section can be reduced, and also reflection from the junction between the photo-attenuator section and the photodetector section can be suppressed. By providing a mode/field converter, a coupling loss can be reduced between an external waveguide such as an optical fiber and the waveguide type light receiving element according to the invention.

Since the waveguide type light receiving element according to the invention is operable over a broad band range and exhibits a low distortion characteristic, it is most suited for use in an optical communication system such as AM-FDM system, for example.

In the invention, an additional waveguide need not be provided so long as the first absorption layer in the photodetector section is optically coupled to the second absorption layer in the photo-attenuator section. However, such an additional waveguide may be provided for improving the transmission characteristic between the photodetector section and photo-attenuator section.

Examples of means for isolating the first electrode pair from the second electrode pair include an electrical isolating means comprising a p-n junction formed at the junction plane between a cladding layer of the first light absorption layer and a cladding layer of the second light absorption layer to isolate the first electrode pair formed on the cladding layer of the first light absorption layer from the second electrode pair formed on the cladding layer of the second light absorption layer, and another electrical isolating means comprising an electrical isolation layer made of a compound semiconductor, semi-insulating compound semiconductor or insulating organic material disposed between the first electrode pair and the second electrode pair for an electrical isolation.

In a preferred embodiment of the invention, the second light absorption layer of the photo-attenuator section is formed in a multiple quantum well structure having a absorption wavelength edge which is shorter than the absorption wavelength edge of the first light absorption layer of the photodetector section, or the second light absorption layer of the photo-attenuator section is formed in a strained super-lattice structure having a absorption wavelength edge which is shorter than the absorption wavelength edge of the first absorption layer of the photodetector section.

By applying a reverse bias voltage between the second electrode pair, the photo-attenuator section functions as a variable photo-attenuator section in which the amount of light absorption varies in accordance with the intensity of the magnitude of the applied reverse bias voltage and based on a fixed relationship therebetween, and controls the magnitude of the reverse bias voltage based on the intensity of the incident light to thereby adjust the intensity of the light propagating to the photodetector section, whereby the sensitivity of the photodetector section can be controlled electrically.

In a further preferred embodiment of the invention, a mode/field converter is provided between the photo-attenuator section and photodetector section. The provision of the mode/field converter enables a higher efficiency in coupling between an external waveguide and the waveguide type light receiving element according to the invention.

In a further preferred embodiment of the invention, the electrical isolation section has an optical path length along the direction of the propagation of light which is designed at an integral multiple of one-half the wavelength of the incident light.

DESCRIPTION OF THE PREFERRED EMBODIMENTS

Referring to the attached drawings, the invention will be more specifically described with reference to the embodiments.

FIRST EMBODIMENT

Figure 1:
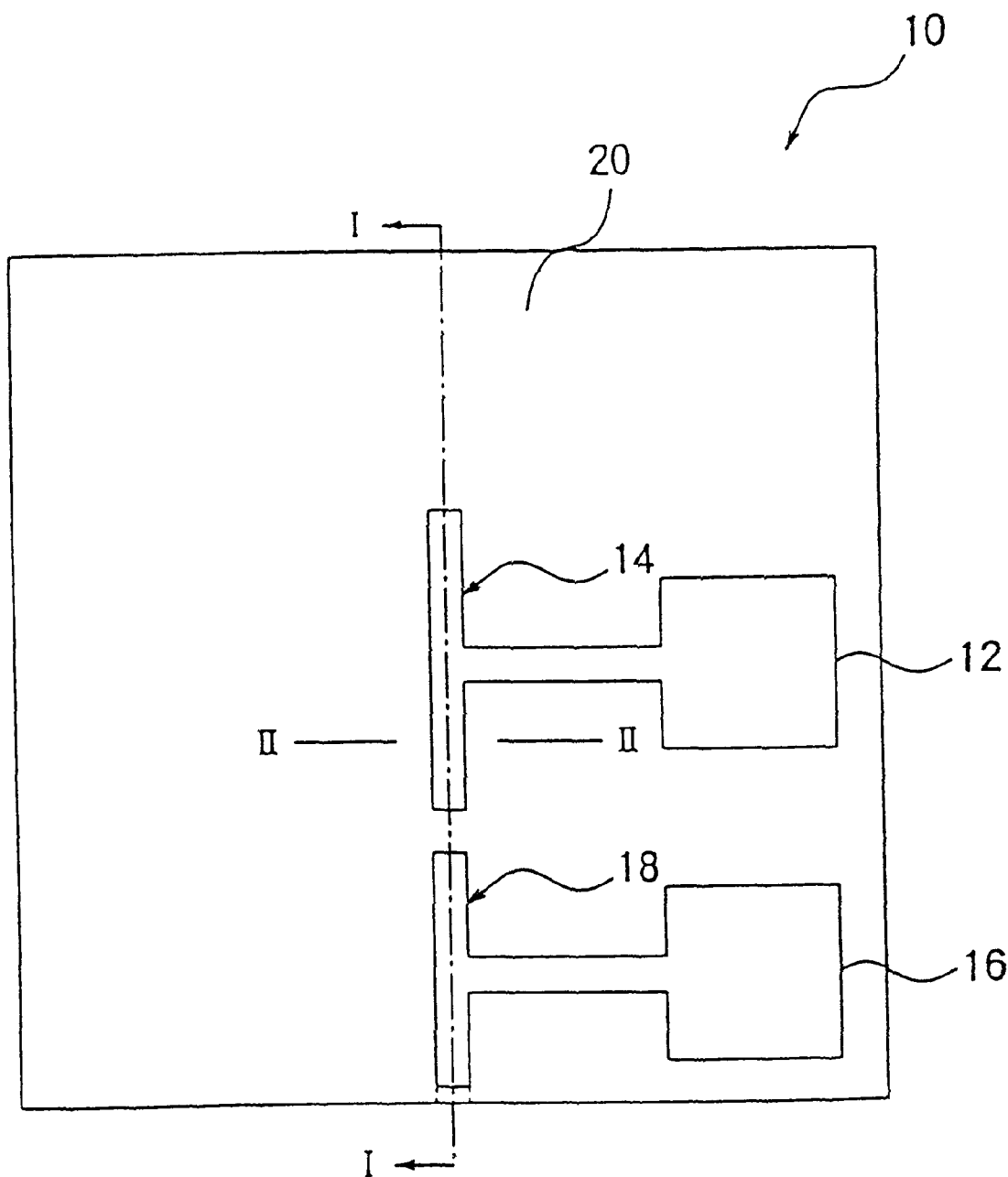
FIG. 1 is a top plan view of a waveguide type light receiving element according to a first embodiment of the invention.
Figure 2:
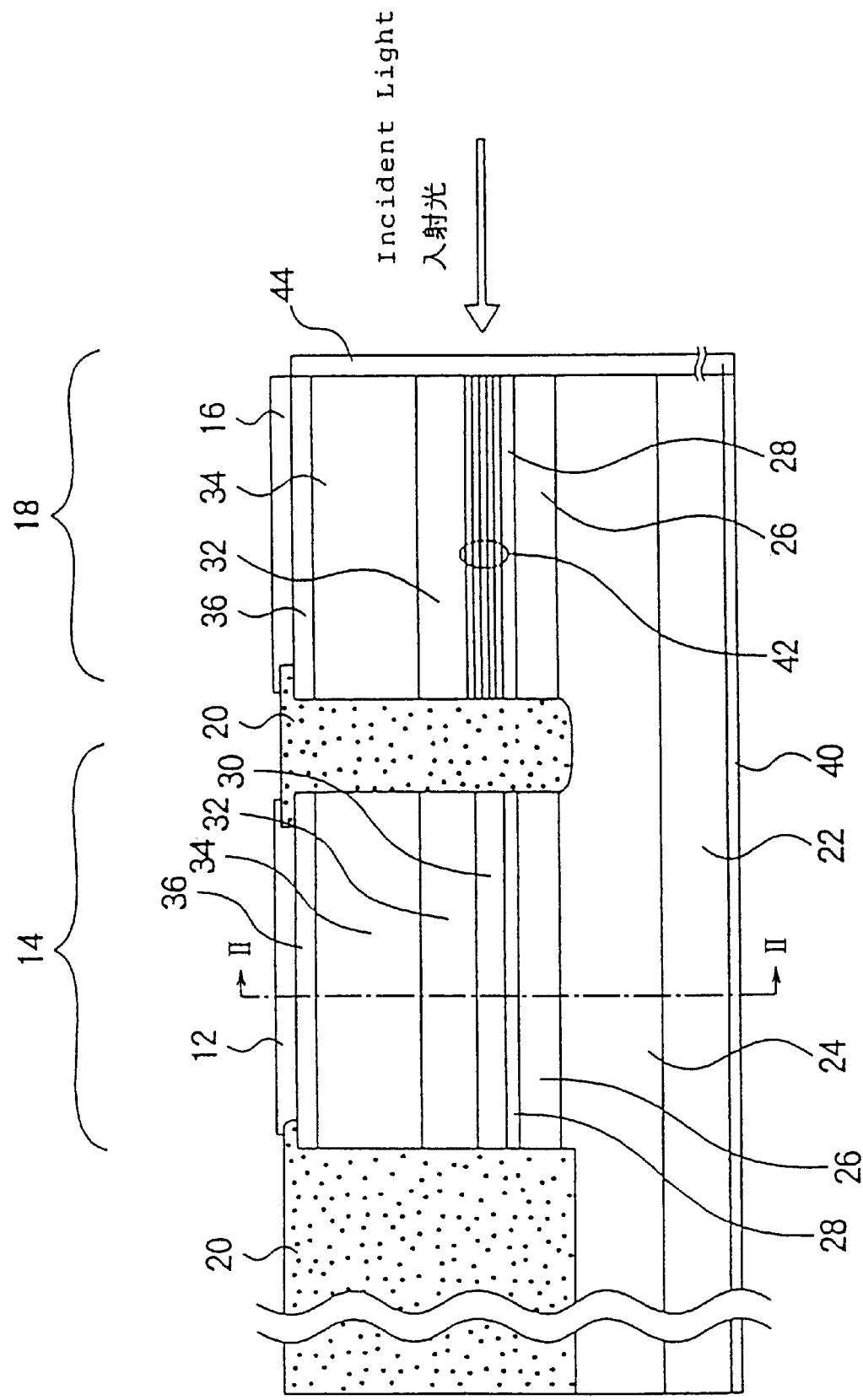
FIG. 2 is a sectional view of the waveguide type light receiving element of FIG. 1, taken along line I—I, i.e., illustrating the sectional structure along the direction of propagation in the waveguide.
Figure 3:
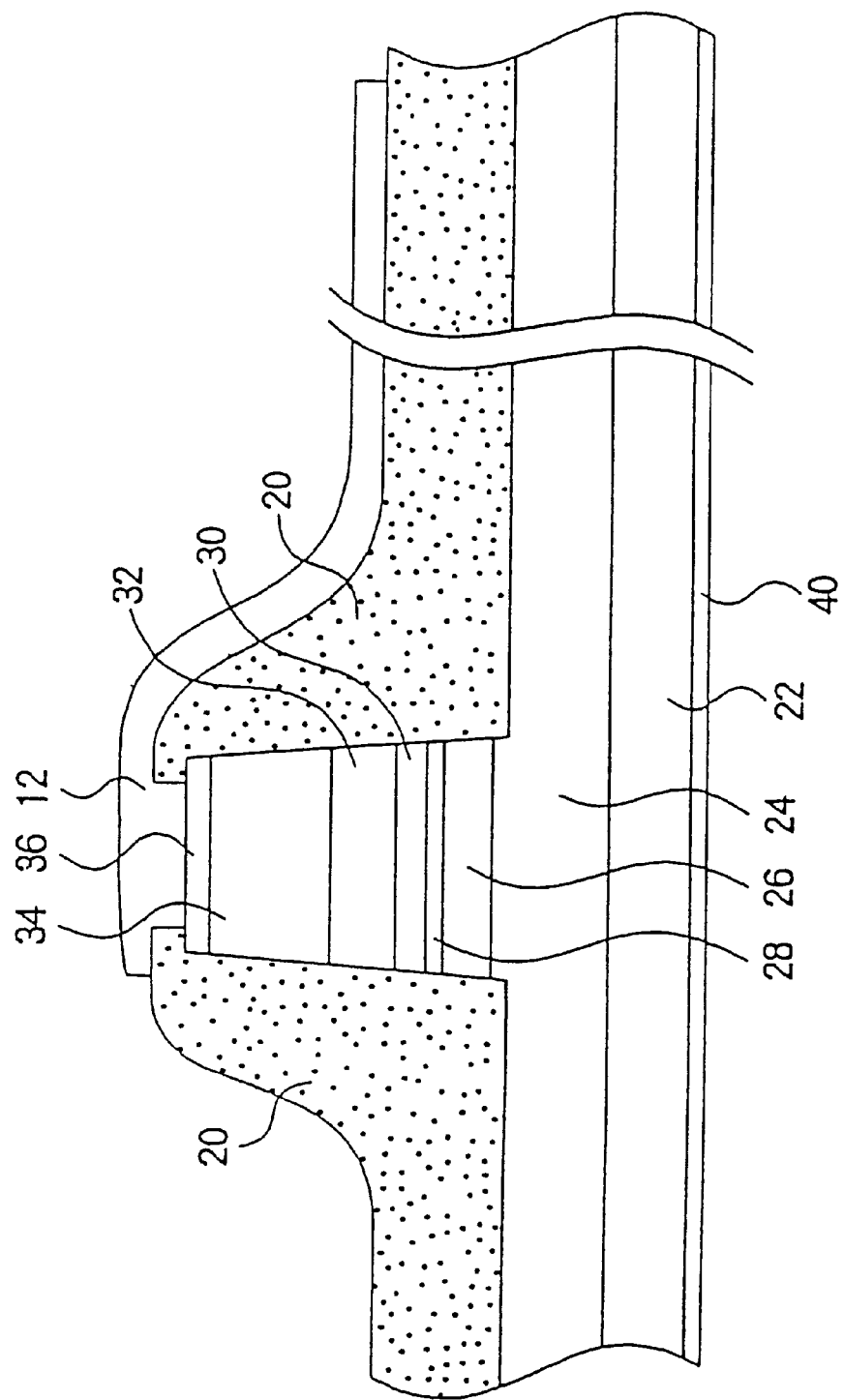
FIG. 3 is a sectional view of the waveguide type light receiving element shown in FIGS. 1 and 2 taken along line II—II.

FIG. 1 is a top plan view of a waveguide type light receiving element according to a first embodiment of the invention, FIG. 2 is a sectional view of the waveguide type light receiving element of FIG. 1, taken along line I—I, illustrating the sectional structure along the direction of propagation in the waveguide, and FIG. 3 is a sectional view of the waveguide type light receiving element shown in FIGS. 1 and 2 and taken along line II—II.

As shown in FIG. 1, the waveguide type light receiving element 10 of the present embodiment (hereinafter abbreviated simply as "element 10") comprises a photodetector section 14 including a photo-detecting p-electrode (hereinafter abbreviated as photo-detecting electrode) 12 disposed in an ohmic contact, a photo-attenuator section 18 including an absorption controlling p-electrode (hereinafter abbreviated as absorption controlling electrode) 16 disposed in an ohmic contact, and an electrical isolation section 20 having a light transmission property and made of polyimide for effecting electrical isolation between the photodetector section 14 and the photo-attenuator section 18.

As shown on the left-hand portion of FIG. 2 and in FIG. 3, the photodetector section 14 comprises n-InP layer 24, n-AlGaInAs light confinement layer 26, n-GaInAsP light guide layer 28, i-GaInAsP light absorption layer 30, p-AlGaInAs light confinement layer 32, p-InP layer 34 and p-GaInAs contact layer 36 which are consecutively laminated on the n-InP substrate 22 in this order to provide a double hetero-junction structure, as well as p-electrode 12 made of TiPtAu for photo-detection and n-electrode 40 made of AuGeNi, which are disposed on the top and bottom, respectively, of the substrate in ohmic contact therewith.

As mentioned above, the light absorption layer and waveguide of the photodetector section 14 is configured to define a light confinement structure in the vertical (up-down) direction, and is also configured to define a light confinement structure in the horizontal direction by defining a ridge structure as shown in FIG. 3.

Except for the fact that the light absorption layer is formed by a strained MQW layer, the photo-attenuator section 18 has a layer structure similar to the layer structure of the photodetector section 14. Specifically, as shown on the right-hand side of FIG. 2, the photo-attenuator section 18 comprises n-InP layer 24, n-AlGaInAs light confinement layer 26, n-GaInAsP light guide layer 28, which are laminated in common with the photodetector section 14 on the n-InP substrate 22, a strained MQW layer 42 laminated thereon and including i-GaInAs films and AlInAs films, and p-AlGaInAs light confinement layer 32, p-InP layer 34, and p-GaInAs contact layer 36 which are further laminated in common with the photodetector section 14, as well as the absorption controlling p-electrode 16 and n-electrode 40 which are provided on the top and bottom, respectively, of the substrate, the n-electrode 40 being common with the photodetector section 14. Instead of the n-electrode 40 which is in common with the photodetector section 14, the n-electrode of the photo-attenuator section 18 may be provided separately.

In the photo-attenuator section 18, n-GaInAsP light guide layer 28 functions as a waveguide while the strained MQW layer 42 formed of i-GaInAs films and AlInAs films function as the light absorption layer.

Similarly to the photodetector section 14, the light absorption layer and the waveguide of the photo-attenuator section 18 are configured to define a light confinement structure in the vertical (up-down) direction, and are also configured to define a light confinement structure in the horizontal direction due to a mesa stripe structure.

An end surface of the element 10 at the photo-attenuator section 18, including the end surface of n-GaInAsP light guide layer 28, constitutes a light incident surface for receiving an incident light, which surface is provided with an anti-reflection film 44.

The photodetector section 14 and photo-attenuator section 18 are electrically isolated from each other by the electrical isolation section 20, which is made of polyimide to have electrical isolation and light transmitting properties.

The thickness of the electrical isolation section 20 between the photo-attenuator section 18 and photodetector section 14 along the direction of the propagation of light, i.e., the optical path length is preferably selected at $N \times (\frac{1}{2}) \times (\lambda/n0)$ so as to minimize the reflection of light propagated from the photo-attenuator section 18 to the photodetector section 14, wherein $\lambda$, $n0$ and M represent the wavelength of the incident signal light, refractive index of polyimide forming the electrical isolation section 20 and an integer, respectively.

A method for fabrication of the element 10 will be briefly described hereinafter.

(1) Initially, n-InP layer 24, n-AlGaInAs light confinement layer 20, n-GaInAsP light guide layer 28, i-GaInAsP light absorption layer 30 and p-AlGaInAs light confinement layer 32 are consecutively formed on n-InP substrate 22 by an epitaxial growth technique.

(2) Subsequently, a mask made of $SiO_2$ film is formed on p-AlGaInAs light confinement layer 32, and portions of the p-AlGaInAs light confinement layer 32 and i-GaInAsP light absorption layer 30 which are located within the region for forming the photo-attenuator section 18 are etched away. Thereafter, by using the $SiO_2$ mask as a growth prohibiting mask, i-GaInAs films and AlInAs films which constitute together the strained MQW layer 42, together with p-GaInAsP light confinement layer 32 are selectively grown by a MOCVD process, gas source MBE process or the like.

(3) $SiO_2$ mask is then removed, and p-GaInAsP light confinement layer 32, p-InP cladding layer 34 and p-GaInAsP contact layer 36 are grown over the entire surface.

(4) The photodetector section 14 and photo-attenuator section 18 are etched to configure a mesa-stripe structure, polyimide is applied to any required region, and unnecessary polyimide portions are removed by a photolithographic and etching technique to form the electrical isolation section 20. Additionally, electrodes 12, 16 and 40 are formed, and the light incident surface 44 is coated with the anti-reflection film 44. The element 10 of the first embodiment as shown in FIGS. 1 to 3 is thus obtained.

Figure 4:
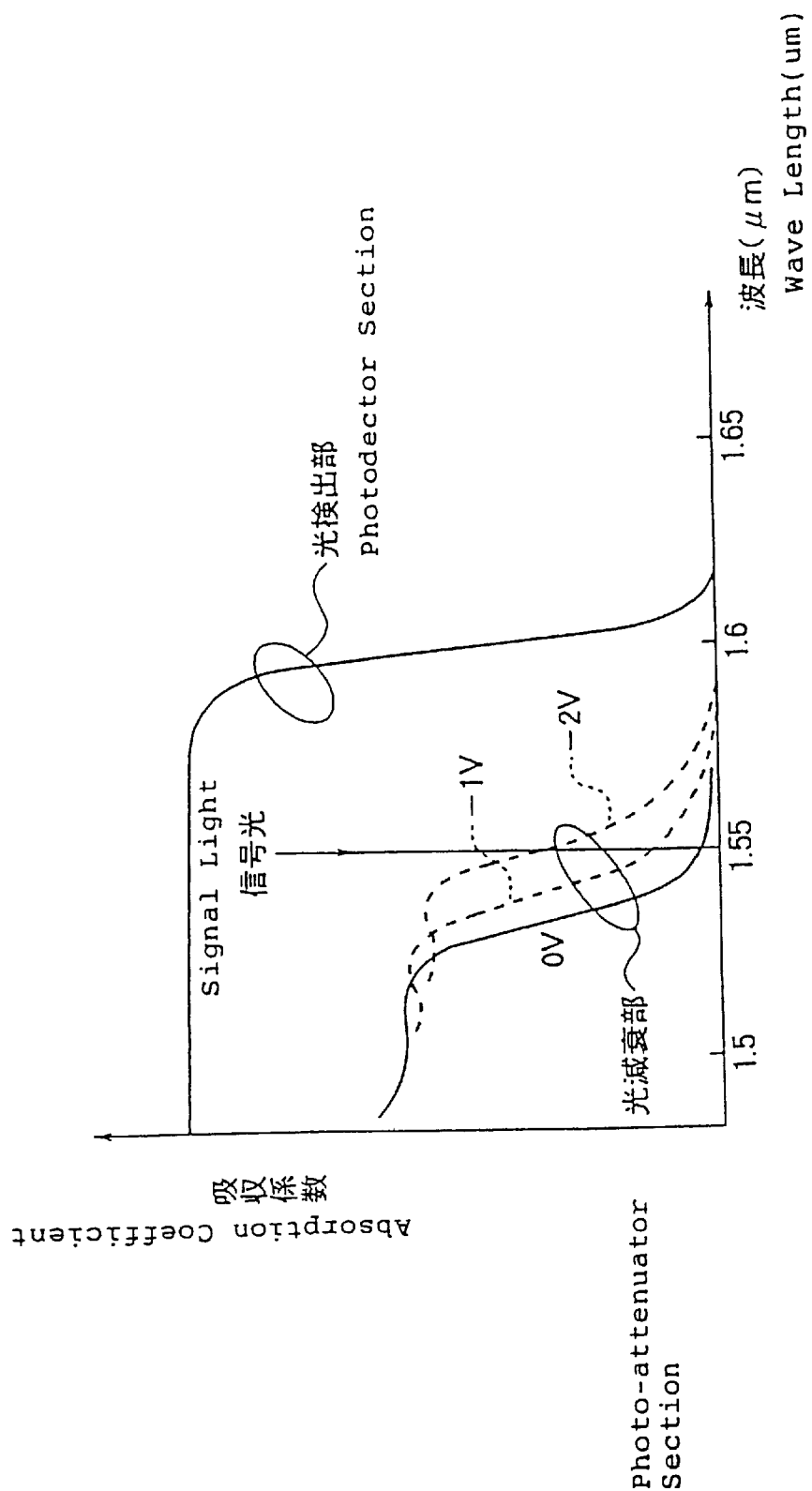
FIG. 4 is a graph illustrating the principle of operation of the first embodiment, plotting absorption coefficient on ordinate against the wavelength plotted on abscissa.

FIG. 4 is a graph illustrating the principle of operation of the element 10 according to the first embodiment, with the absorption coefficient being plotted on ordinate against the wavelength plotted on abscissa. The light absorption layer 30 formed by i-GaInAsP in the photodetector section 14 has an absorption wavelength edge at 1.6 $\mu$m, and exhibits an absorption spectrum characteristic as shown in FIG. 4. On the other hand, the light absorption layer 42 of the photo-attenuator section 18 formed by the strained MQW including i-GaInAs films and AlInAs films has an absorption wavelength edge which is slightly less than the wavelength of the signal light, i.e., 1.55 $\mu$m.

When a reverse bias is applied across the p-n junction sandwiching therebetween the strained MQW layer 42, a quantum confinement stark effect or the like causes the absorption characteristic of the strained MQW layer 42 to be shifted toward a longer wavelength, as illustrated in FIG. 4, thereby achieving a shift toward a longer wavelength on the order of 10 to 20 nm with respect to an applied voltage of 2–3 V, for example.

This means that by changing the magnitude of the applied reverse bias voltage, the absorption of the strained MQW layer 42 can be controlled with respect to the signal light having a wavelength 1.55 μm in a variable manner and with a good accuracy, as illustrated in FIG. 4, to thereby function the photo-attenuator section 18 as a variable attenuation region.

Accordingly, by establishing a relationship between the applied voltage and shift toward longer wavelength beforehand by experiments etc., it is possible to attenuate the incident light incident upon the element 10 to a given level based on the intensity of the incident light to the photo-attenuator section 18 by adjusting the applied voltage, whereby the attenuated incident light can be converted in the photodetector section 14 into a photo-current to be detected as an electric signal.

Thus, with the present embodiment, even a light receiving element which is constructed to exhibit a sufficient sensitivity to the intensity of a received light of a small intensity signal can be made to exhibit a wide dynamic range response without degrading the linearity in the photo-electric conversion over a broad band range and over an increased breadth of intensities of signal light, thereby allowing the photodetector section to exhibit a variable sensitivity. This is obtained by increasing the attenuation by the photo-attenuator section 18 for a higher intensity of the incident light, and conversely, by decreasing the attenuation by the photo-attenuator section for a lower intensity of the incident light.

SECOND EMBODIMENT

Figure 5:
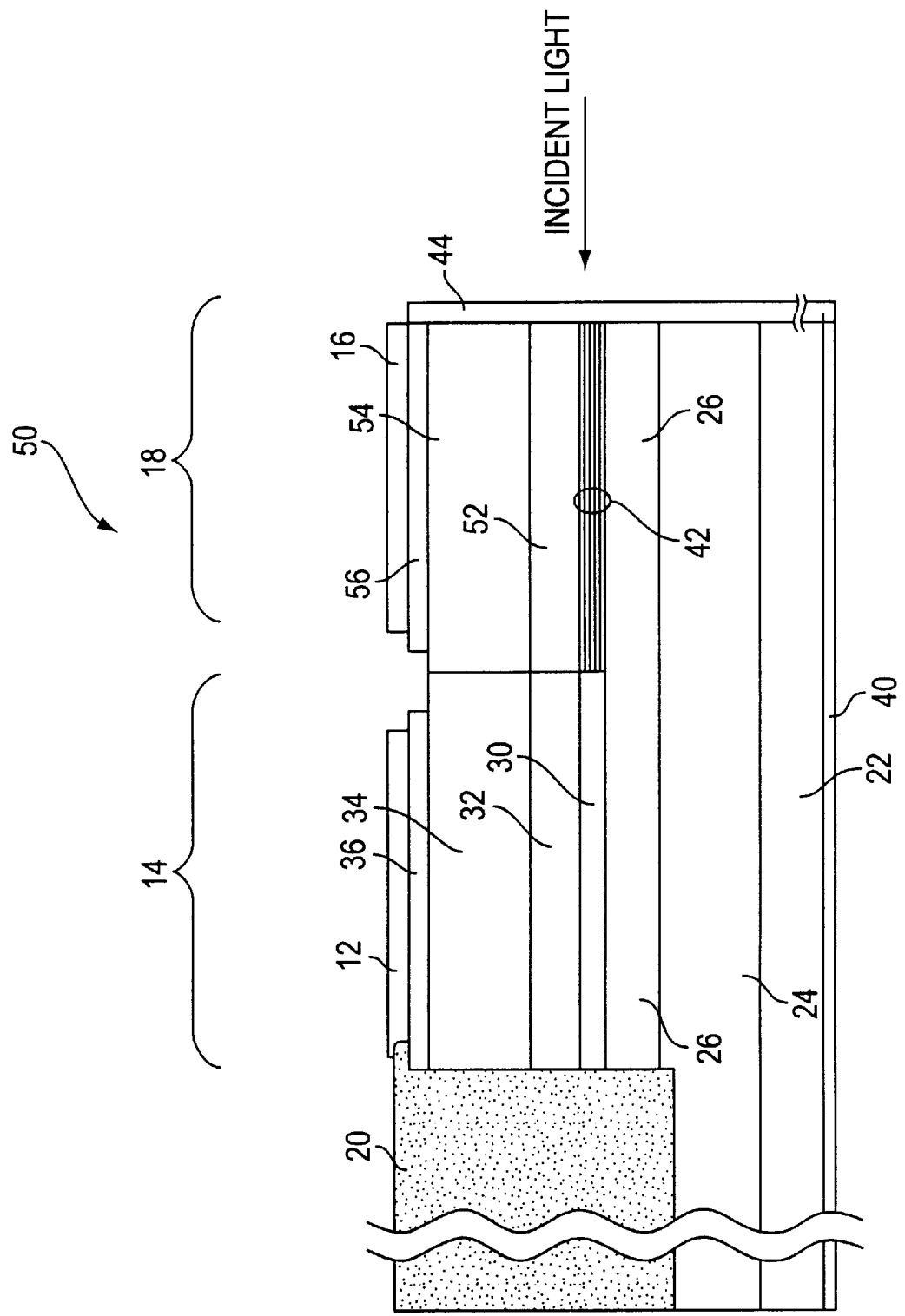
FIG. 5 is a sectional view showing the layer structure of the waveguide type light receiving element according to a second embodiment of the invention.

Referring to FIG. 5, it will be noted that a waveguide type light receiving element 50 according to a second embodiment has a layer structure for the photodetector section 14, which is similar to the layer structure of the photodetector section 14 in the element 10 of the first embodiment except for the absence of n-GaInAsP light confinement layer 28 in the present embodiment.

In the layer structure of the photo-attenuator section 18, the layer structure disposed between the strained MQW layer 42 and n-electrode 40 is similar to the layer structure of the photodetector section 14 of the element 10 of the first embodiment except for the absence of n-GaInAsP light guide layer 28 in the present embodiment. On the other hand, the layers disposed between the strained MQW layer 42 and the absorption controlling p-electrode 16 are formed of n-type semiconductor layers, which are of the same conductivity type as the semiconductor layers located between the strained MQW layer 42 and n-electrode 40. Specifically, they are formed of n-AlGaInAs layer 52, n-InP layer 54, and n-GaInAs contact layer 56 which are consecutively formed on the strained MQW layer 42.

In the waveguide type light receiving element 50 of the present embodiment, the p-n junction formed between the semiconductor layer on the light absorption layer 30 of the photodetector section 14 and the semiconductor layer on the strained MQW layer 42 of the photo-attenuator section 18 provides an electrical isolation between the electrode pair 12 and 40 of the photodetector section 14 and the electrode pair 16 and 40 of the photo-attenuator section 18.

THIRD EMBODIMENT

Figure 6:
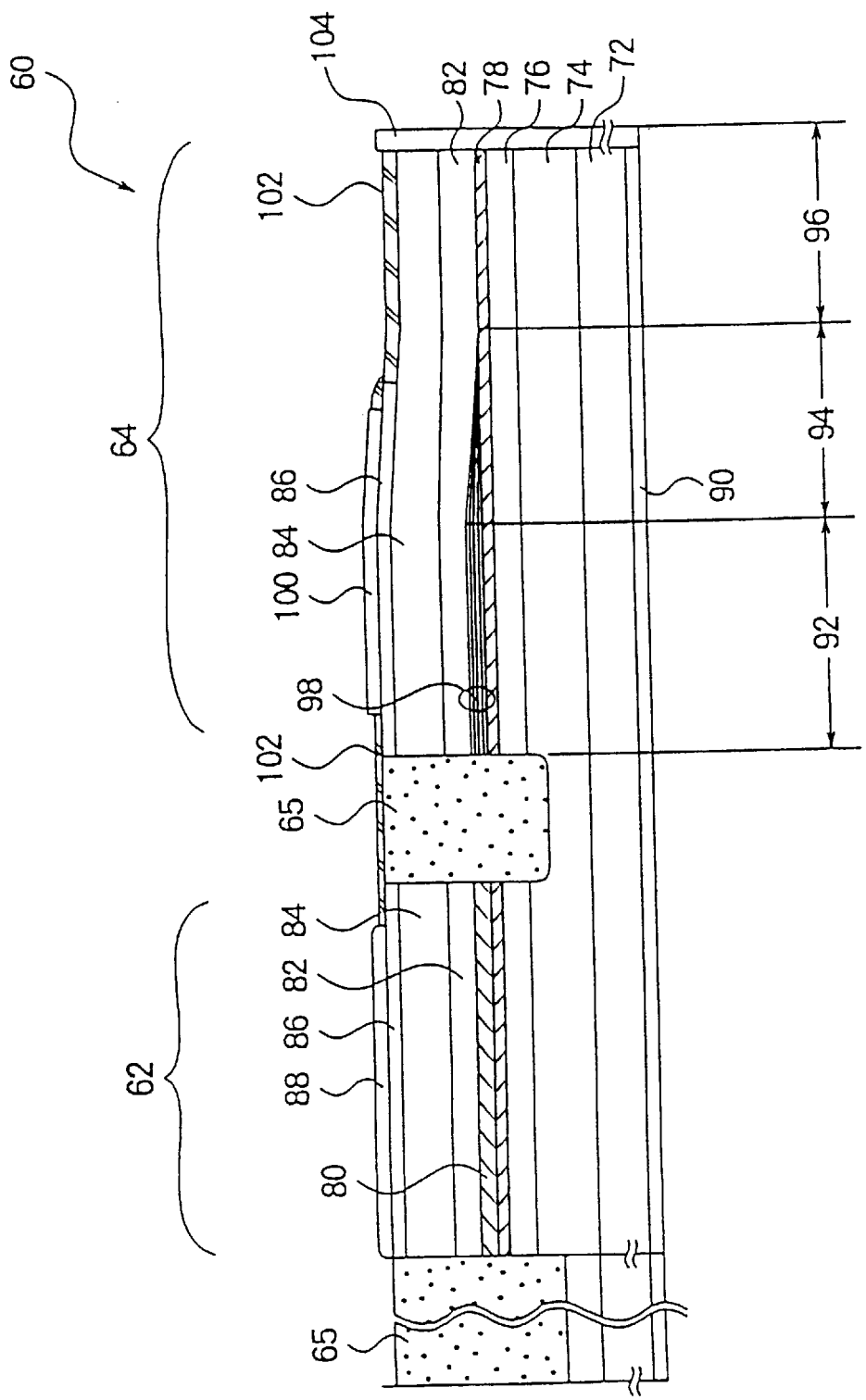
FIG. 6 is a sectional view showing the layer structure of the waveguide type light receiving element according to a third embodiment of the invention.

A waveguide type light receiving element according to the third embodiment of the invention is directed to a waveguide type light receiving element wherein a mode/field converter (MFC) is integrated in the photo-attenuator section. FIG. 6 is a sectional view illustrating the layer structure.

The light receiving element 60 of the waveguide type (referred to as simply element 60 hereinafter) according to the present embodiment comprises a photodetector section 62 having a structure similar to that of the photodetector section 14 of the first embodiment, a photo-attenuator section 64 having a a mode/field converter in addition to the structure of the photo-attenuation section 18 of the element 10 of the first embodiment. The photodetector section 62 and the photo-attenuator section 64 are electrically isolated from each other by an electrical isolation section 65 which is made of polyimide to provide both an electrical isolation and light transmission properties.

The photodetector section 62 comprises n-InP layer 74, n-AlGaInAs light confinement layer 76, n-GaInAsP light guide layer 78, i-GaInAsP light absorption layer 80, p-AlGaInAs light confinement layer 82, p-InP layer 84 and p-GaInAs contact layer 86 which are consecutively laminated on n-InP substrate 72 to provide a double heterojunction structure, as well as p-electrode 88 for photo-conversion and n-electrode 90 which are disposed on the top and bottom, respectively, of the substrate, the n-electrode being made of AuGeNi alloy plated with Au. In the photodetector section 62, n-GaInAsP light guide layer 78 functions as a waveguide.

As shown in FIG. 6, the photo-attenuator section 64 comprises a variable attenuator sub-section 92, a mode/field converter sub-section 94 and a waveguide sub-section 96, which are formed to be integral with each other and consecutively disposed from the photodetector section 62 toward the light incident surface 104.

The variable attenuator sub-section 92 has a structure similar to that of the photo-attenuator section 18 of the first embodiment. Specifically, the variable attenuator sub-section 92 comprises n-InP layer 74, n-AlGaInAs light confinement layer 76, n-GaInAsP light guide layer 78 which are laminated on n-InP substrate 72 in common with the photodetector section 62, a strained MQW layer 98 formed thereon and including i-GaInAs films and AlInAs films, and p-AlGaInAs light confinement layer 82, p-InP layer 84 and p-GaInAs contact layer 86 which are further laminated in common with the photodetector section 62, as well as absorption controlling p-electrode 100 and n-electrode 90 which is in common with the photodetector 62, both provided on the top and bottom of the substrate.

In the variable attenuator sub-section 92, the strained MQW layer 98 comprising i-GaInAs/AlInAs films functions as a light absorption layer, and n-GaInAsP light guide layer 78 functions as a waveguide throughout the mode/field converter sub-section 94, the waveguide sub-section 96 and the variable attenuator sub-section 92.

In the mode/field converter sub-section 94, each of i-GaInAs films and AlInAs films which constitute the strained MQW layer 98 is configured to be gradually tapered n-GaInAsP light guide layer 78 to have a smaller thickness as viewed in a direction toward the light incident surface 104 for receiving the incident light. In this configuration, the strained MQW layer 98 is formed as a tapered section which is inclined downward toward the n-GaInAsP light guide layer 78 as viewed in the direction toward the light incident surface 104. Except for the provision of the tapered section, the mode/field converter 94 has a laminate layer structure similar to the variable attenuator sub-section 92.

The waveguide sub-section 96 has a layer structure similar to that of the variable attenuator sub-section 92 except that p-GaInAs contact layer 86 and absorption controlling p-electrode 100 are replaced by SiNx layer 102 disposed on p-InP layer 84 and that the strained MQW layer 98 is not provided in the present embodiment. One of the end surfaces of the element 60 at the photo-attenuator section 64, including an end surface of n-GaIsAsP light guide layer 78, defines the light incident surface 104 for receiving the incident light, which surface is provided with an anti-reflection film 104.

FABRICATION OF THIRD EMBODIMENT

Figure 7:
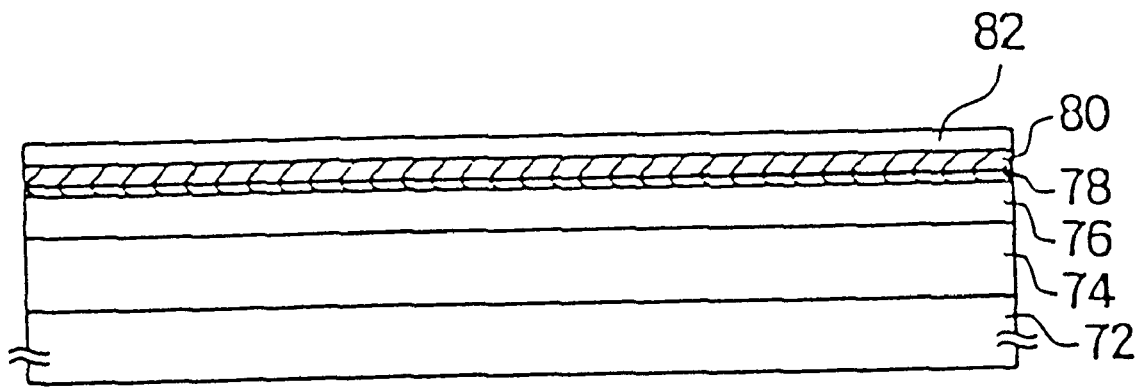
FIG. 7 is a sectional view of a substrate for illustrating a fabrication step of the waveguide type light receiving element of the third embodiment of the invention.
Figure 8A:
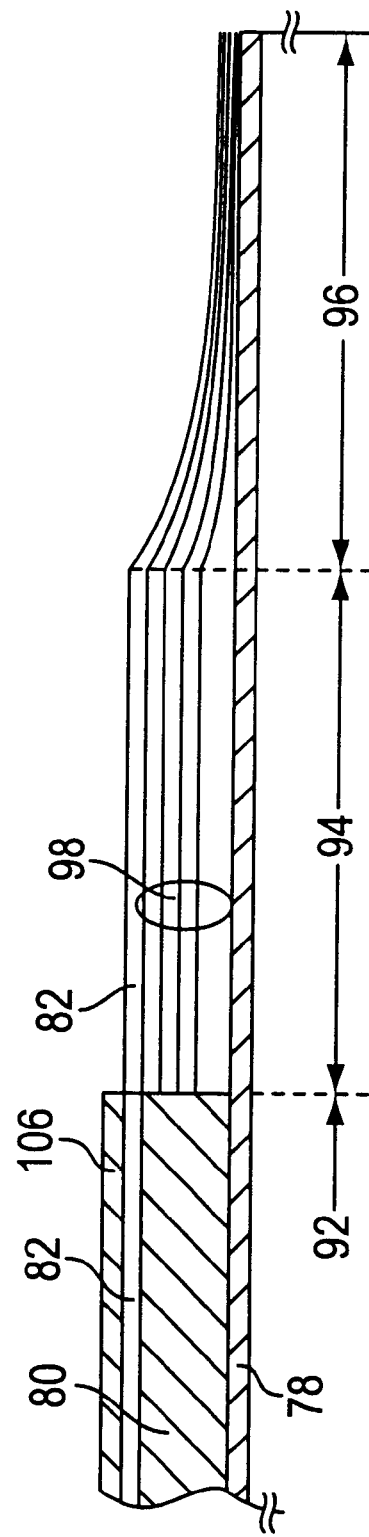
FIG. 8(a) is a sectional view of the substrate for illustrating another fabrication step of the third embodiment following the step of FIG. 7.
Figure 8B:
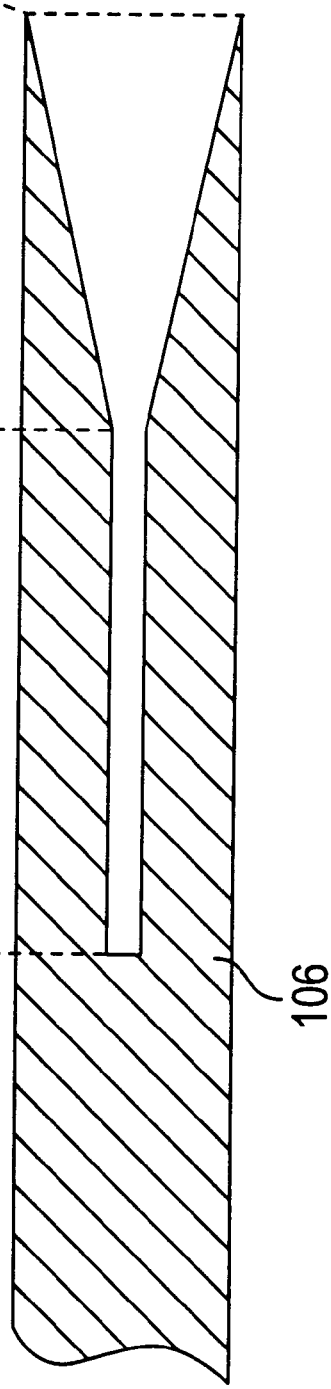
FIG. 8(b) is a top plan view of FIG. 8(a)
Figure 9:
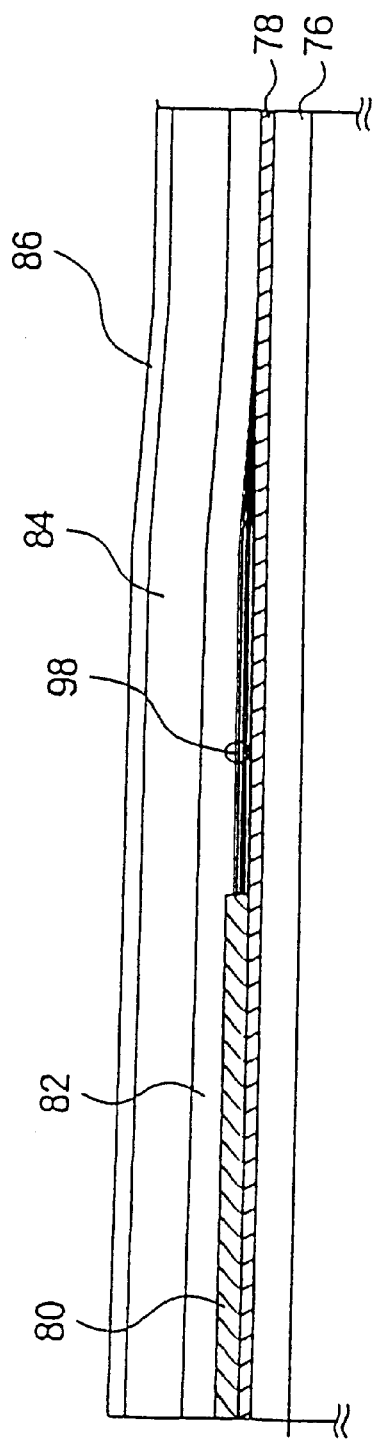
FIG. 9 is a sectional view of the substrate for illustrating another fabrication step of the third embodiment following the step of FIGS. 8(a) and 8(b)
Figure 10:
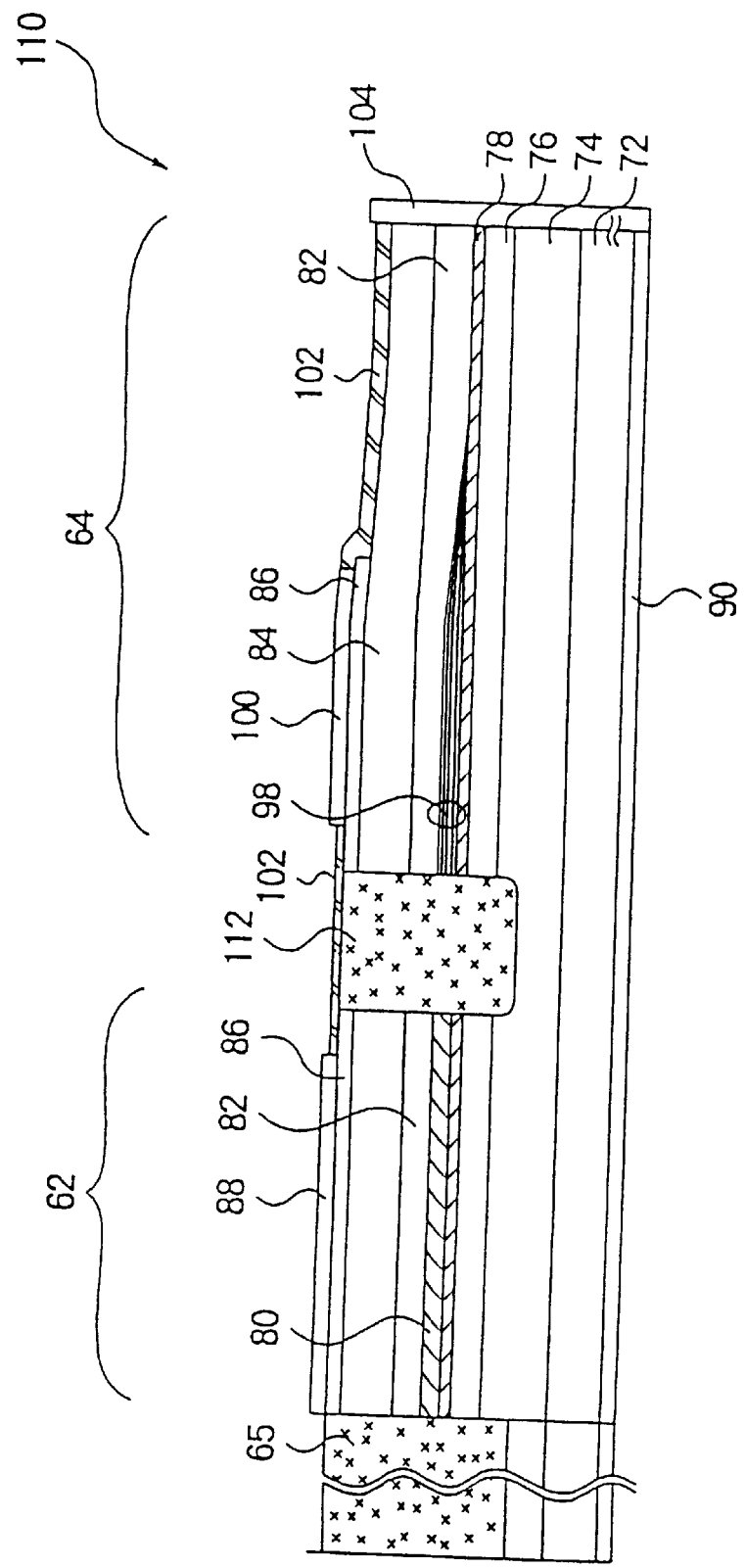
FIG. 10 is a sectional view showing the layer structure of a waveguide type light receiving element according to a fourth embodiment of the invention.
Figure 11:
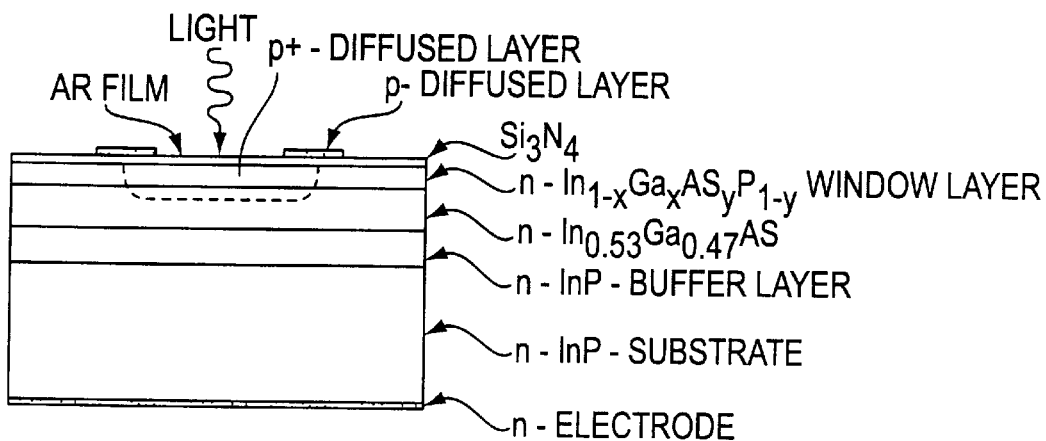
FIG. 11 is a structural view illustrating the layer structure of a conventional surface input type pin photodiode.
Figure 12A:
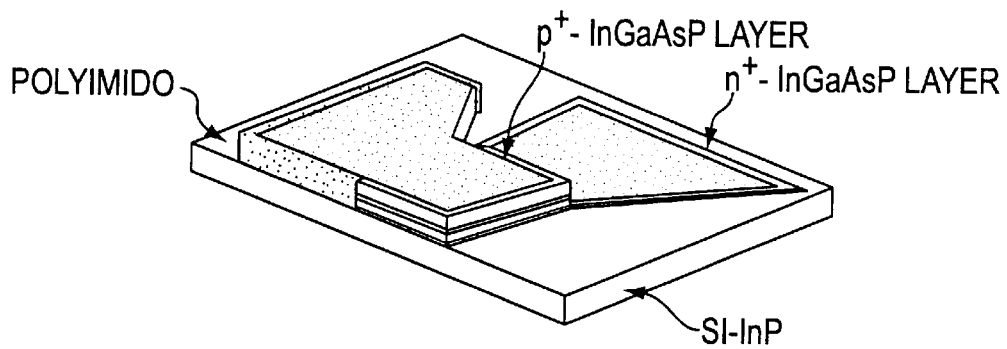
FIG. 12(a) is a perspective view of a conventional waveguide type pin photodiode.
Figure 12B:
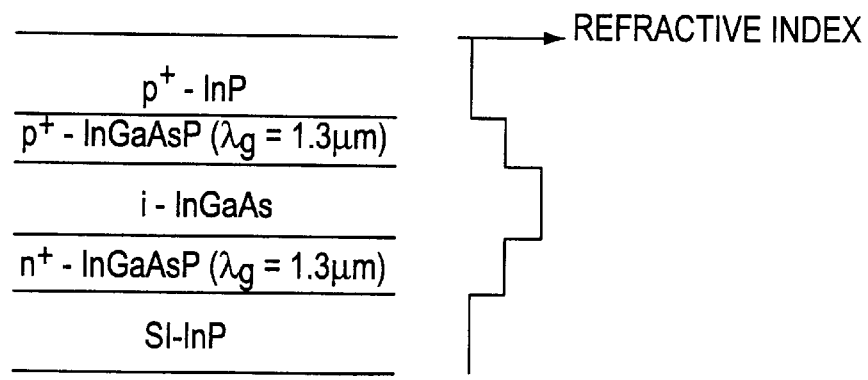
FIG. 12(b) is a perspective view illustrating the layer structure of the waveguide type pin photodiode of FIG. 12(a).

Referring to FIGS. 7 to 9, fabrication steps for the element 60 of the third embodiment will be described hereinafter.

(1) Initially, n-InP layer 74, n-AlGaIns light confinement layer 76, n-GaInAsP light guide layer 78, i-GaInAsP light absorption layer 80 and p-AlGaInAs light confinement layer 82 are consecutively formed on n-InP substrate 72 by an epitaxial growth technique, as illustrated in FIG. 7.

(2) Subsequently, a mask 106 made of SiO$_2$ film is formed on p-AlGaIs light confinement layer 82 as shown in FIG. 8(b), followed by removal by etching of p-AlGaInAs light confinement layer 82 and i-GaInAsP light absorption layer 80 in the regions of the variable attenuator sub-section 92, the mode/field converter sub-section 94 and the waveguide sub-section 96. Subsequently, by using the SiO$_2$ mask 106 as a growth prohibiting mask, i-GaInAs films and AlInAs films which form the strained MQW layer 98, as well as p-GaInAsP light confinement layer 82, are selectively grown by a MOCVD process, gas source MBE process or the like.

As a consequence, the thickness of individual layers which form the strained MQW layer 98 are gradually reduced toward n-GaInAsP light guide layer 78 as viewed in the direction toward the light incident surface to thereby form a tapered strained MQW layer 98, as illustrated in FIG. 8(a).

(3) As shown in FIG. 9, SiO$_2$ mask 106 is then removed, followed by growth of p-GaInAsP light confinement layer 82, p-InP cladding layer 84 and p-GaInAsP contact layer 86 over the entire surface.

(4) The photodetector section 62 and photo-attenuator section 64 are etched to form a mesa-stripe structure, followed by removal of p-GaInAsP contact layer 86 beforehand in the regions of the mode/field converter sub-section 94 and the waveguide sub-section 96. Subsequently, polyimide is applied in a required region, followed by removal of unnecessary polyimide portions by a photolithographic and etching technique to thereby form an electrical isolation section 65. Further, electrodes 88, 90 and 100 are formed, and the light incident surface 104 is coated with the anti-reflection film 104, thereby providing the element 60 shown in FIG. 6.

In the present embodiment, the incident light incident to the element 60 is attenuated to a given level in a variable manner based on the intensity of the incident light, by adjusting the applied voltage in a manner similar to that in the first embodiment, and is then detected as an electric signal by the photodetector section 62.

This allows even the light receiving element which is constructed to provide a sufficient sensitivity to the intensity of a small signal light, to exhibit a wide dynamic range response without degrading the linearity in the photoelectric conversion over a broad band range for the signal lights having intensities of a wide range, as by increasing the attenuation by the photo-attenuator section 64 for a higher intensity of the incident light, or conversely, decreasing the attenuation by the photo-attenuation section 64 for a lower intensity of the incident light, to thereby provide a variable sensitivity of the photodetector section.

In the present embodiment, the light absorption layer 98 of the photo-attenuator section 64 is provided as a super-lattice structure instead of the strained MQW.

FOURTH EMBODIMENT

A waveguide type light receiving element 110 according to the present embodiment includes an electrical isolation section 112, which provides an electrical isolation between a photodetector section and a photo-attenuator section, and in which the polyimide used in the third embodiment is replaced by a semi-insulating compound semiconductor formed by implanting protons into a compound semiconductor such as semi-insulating InP, for example. The layer structure of the photodetector section and photo-attenuator section is similar to that of the third embodiment.

In addition to the selective growth technique utilizing a SiO$_2$ mask as illustrated in the third and fourth embodiments, the mode/field converter of the photo-attenuator section may be fabricated by forming a tapered ridge stripe in which the width of the ridge is reduced as viewed in the direction parallel to the junction plane, and by subsequent growth of MQW layer thereon.

The light incident surface may be formed not perpendicular to the incident light, but may be provided as a sloped end surface.

In the above description, materials for the waveguide type light receiving element according to the invention included GaInAsP/InP or AlGaInAs/InP laminated on the InP substrate. However, the materials may be GaInAsSb/Inp, AlGaAs/GaAs and GaInAs/GaAs as well. The substrate used in the light receiving element of the invention may be a p-type compound semiconductor substrate or semi-insulating (S.I.) compound semiconductor substrate instead of the n-type compound semiconductor substrate.

We claim:

1. A waveguide type light receiving element comprising:

a photodetector section having at least a first light absorption layer and a first electrode pair for deriving an electrical signal from said first light absorption layer; and a photo-attenuator section having at least a second light absorption layer disposed between said photodetector section and a light incident surface and optically coupled to said first light absorption layer, and a second electrode pair electrically isolated from said first electrode pair for applying a voltage to said second light absorption layer, wherein said second light absorption layer of said photo-attenuator section comprises a multiple quantum well structure having an absorption wavelength edge which is shorter than an absorption wavelength edge of said first light absorption layer of said photodetector section.

2. A waveguide type light receiving element comprising:

a photodetector section having at least a first light absorption layer and a first electrode pair for deriving an electrical signal from said first light absorption layer; and a photo-attenuator section having at least a second light absorption layer disposed between said photodetector section and a light incident surface and optically coupled to said first light absorption layer, and a second electrode pair electrically isolated from said first electrode pair for applying a voltage to said second light absorption layer, wherein said second light absorption layer of said photo-attenuator section comprises a strained super-lattice structure having an absorption wavelength edge which is shorter than an absorption wavelength edge of said first light absorption layer of said photodetector section.

* * * * *